(12) United States Patent
Satoi

(10) Patent No.: US 12,048,249 B2
(45) Date of Patent: Jul. 23, 2024

(54) PIEZOELECTRIC ACTUATOR

(71) Applicant: KYOCERA Corporation, Kyoto (JP)

(72) Inventor: Shinsaku Satoi, Kirishima (JP)

(73) Assignee: KYOCERA Corporation, Kyoto (JP)

( * ) Notice: Subject to any disclaimer, the term of this patent is extended or adjusted under 35 U.S.C. 154(b) by 802 days.

(21) Appl. No.: 17/255,076

(22) PCT Filed: Jun. 21, 2019

(86) PCT No.: PCT/JP2019/024726
§ 371 (c)(1),
(2) Date: Dec. 22, 2020

(87) PCT Pub. No.: WO2020/004269
PCT Pub. Date: Jan. 2, 2020

(65) Prior Publication Data
US 2021/0249584 A1    Aug. 12, 2021

(30) Foreign Application Priority Data
Jun. 28, 2018 (JP) .................................. 2018-123308

(51) Int. Cl.
*H10N 30/88* (2023.01)
*H10N 30/20* (2023.01)
*H10N 30/50* (2023.01)
*H10N 30/853* (2023.01)

(52) U.S. Cl.
CPC ........... *H10N 30/886* (2023.02); *H10N 30/20* (2023.02); *H10N 30/50* (2023.02); *H10N 30/8542* (2023.02)

(58) Field of Classification Search
CPC .. H10N 30/886; H10N 30/8542; H10N 30/50; H10N 30/20
See application file for complete search history.

(56) References Cited

U.S. PATENT DOCUMENTS 5,239,223 A * 8/1993 Miyoshi ............... H10N 30/886
310/340
2018/0003312 A1    1/2018 Schupp et al.

FOREIGN PATENT DOCUMENTS

| JP | 2844711 | B2 | * | 8/1989 | |
| JP | 03175683 | A | * | 7/1991 | ......... H01L 41/0536 |
| JP | H0661544 | A | * | 5/1992 | |
| JP | 04-165683 | A | | 6/1992 | |
| JP | H06283778 | A | * | 3/1993 | |
| JP | 11-022845 | A | | 1/1999 | |
| JP | 2018-007360 | A | | 1/2018 | |

* cited by examiner

Primary Examiner — J. San Martin
(74) Attorney, Agent, or Firm — Volpe Koenig

(57) ABSTRACT

A piezoelectric actuator includes: a piezoelectric element; and a case including a base body and a tubular body, the case being configured to receive the piezoelectric element. The base body includes a bottom plate portion and an annular projection disposed upright on the bottom plate portion. The annular projection includes an upper-side first region having a relatively small outside diameter and a lower-side second region having a relatively large outside diameter, and includes a stepped outer surface defined by an outer surface of the first region and an outer surface of the second region that are connected with each other. The first region is inserted inside the tubular body, an end face of the tubular body abuts on an upper end of the second region, and the tubular body and the second region is joined to each other.

17 Claims, 6 Drawing Sheets

PIEZOELECTRIC ACTUATOR

CROSS-REFERENCE TO RELATED APPLICATION

This application is a national stage entry according to 35 U.S.C. 371 of International Application No. PCT/JP2019/024726, filed on Jun. 21, 2019, which claims priority to Japanese Patent Application No. 2018-123308, filed on Jun. 28, 2018, the contents of which are entirely incorporated herein by reference.

TECHNICAL FIELD

The present disclosure relates to a piezoelectric actuator.

BACKGROUND

One of heretofore known piezoelectric actuators is disclosed in Japanese Unexamined Patent Publication JP-A 4-165683 (1992) (hereafter referred to as Patent Literature 1). The piezoelectric actuator includes: a piezoelectric element; and a case including a base body and a tubular body, the case receiving therein the piezoelectric element. In this piezoelectric actuator, for example, the tubular body includes a stepped lower end to provide a flange, and, an annular projection disposed on an upper surface of the base body is fitted into the lower end of the tubular body. With a compressive load applied to the piezoelectric element, the base body and the tubular body are joined to each other.

SUMMARY

A piezoelectric actuator according to the disclosure includes: a piezoelectric element and a case including a base body and a tubular body, the case being configured to receive the piezoelectric element, the base body including a bottom plate portion and an annular projection disposed upright on the bottom plate portion, the annular projection including a first region, the first region being inserted inside the tubular body, a second region located below the first region, the second region having a relatively large outside diameter compared to the first region, an end face of the tubular body abutting on an upper end of the second region, and the second region being joined to the tubular body; and a stepped outer surface defined by an outer surface of the first region and an outer surface of the second region that are connected with each other.

DETAILED DESCRIPTION

Embodiments of a piezoelectric actuator according to the disclosure will now be described with reference to drawings. Note that the following embodiment is not intended to be limiting of the invention.

Figure 1:
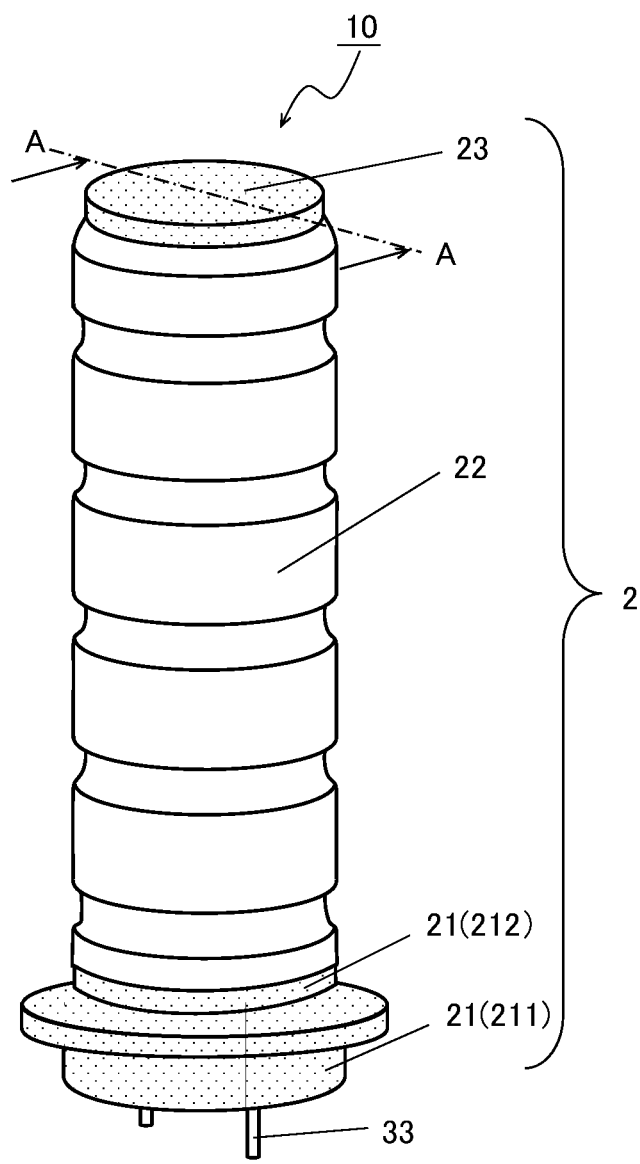
FIG. 1 is a schematic perspective view showing an embodiment of a piezoelectric actuator.
Figure 2:
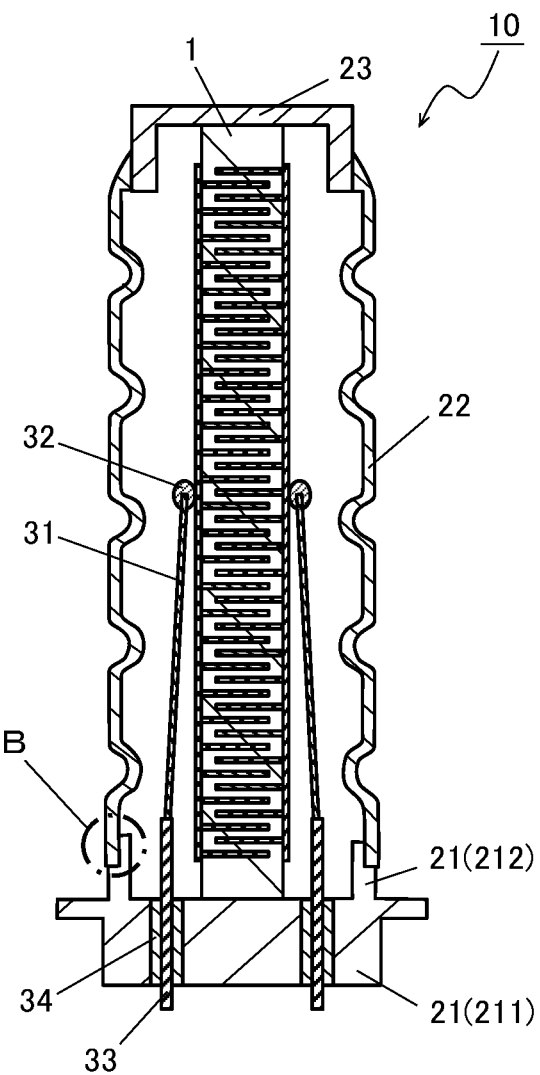
FIG. 2 is a schematic longitudinal sectional view of the embodiment of the piezoelectric actuator taken along the line A-A shown in FIG. 1.
Figure 3:
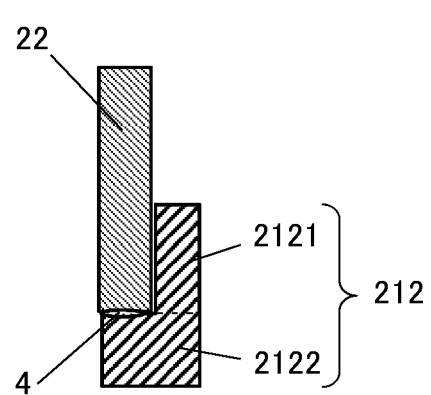
FIG. 3 is an enlarged sectional view of an area B (principal part) of the piezoelectric actuator shown in FIG. 2.

A piezoelectric actuator 10 shown in FIGS. 1 to 3 comprises: a piezoelectric element 1; and a case 2 including a base body 21 and a tubular body 22, the case 2 being configured to receive therein the piezoelectric element 1.

As shown in FIG. 2, for example, the piezoelectric element 1 constituting the piezoelectric actuator 10 is built as a multilayer piezoelectric element including a laminate including an active portion in which alternating piezoelectric layers and internal electrode layers are alternately laminated, and an inactive portion in which piezoelectric layers are laminated on each end in a lamination direction of the active portion. The active portion is a portion in which the piezoelectric layers undergo extension or contraction in the lamination direction during driving of the piezoelectric element, and the inactive portion is a portion in which the piezoelectric layers undergo neither extension nor contraction in the lamination direction during driving of the piezoelectric element.

For example, the laminate constituting the piezoelectric element 1 is shaped in a rectangular prism which has a longitudinal dimension of about 4 mm to 7 mm, a lateral dimension of 4 mm to 7 mm, and a height of 20 mm to 50 mm. Alternatively, the laminate may be shaped in a hexagonal prism or an octagonal prism, for example.

The piezoelectric layers constituting the laminate are each made of piezoelectric ceramics having piezoelectric properties. For example, the piezoelectric ceramics has an average particle size of 1.6 µm to 2.8 µm. Examples of the piezoelectric ceramics include a perovskite oxide containing lead zirconate titanate ($PbZrO_3$—$PbTiO_3$), lithium niobate ($LiNbO_3$), and lithium tantalate ($LiTaO_3$).

Moreover, the internal electrode layers constituting the laminate each contain metal, e.g. silver, silver-palladium, silver-platinum, or copper, as a main component. For example, positive electrodes and negative electrodes are alternately arranged in the lamination direction. The positive electrode is led out to one of side faces of the laminate, and the negative electrode is led out to the other of the side faces. With this arrangement, in the active portion, a driving voltage can be applied to each piezoelectric layer sandwiched between the internal electrode layers disposed adjacent each other in the lamination direction.

The laminate may contain a metallic layer or the like which does not function as the internal electrode layer but serves as a layer for stress relaxation.

Moreover, an external electrode is disposed on each of a pair of opposed side faces of the laminate to which the positive electrodes or the negative electrodes (or grounding electrodes) of the internal electrode layers are led out, and is electrically connected to the led-out internal electrode layers. For example, the external electrode is constructed of a metallized layer containing silver and glass.

Meanwhile, both of the positive electrodes and the negative electrodes (or grounding electrodes) of the internal electrode layers are exposed on the other pair of opposed side faces of the laminate. On an as needed basis, these side faces are each provided with a cover layer containing an insulator. The formation of the cover layer permits prevention of creeping discharge that occurs between the positive and negative electrodes on the application of a high voltage during driving of the piezoelectric element. As the insulator constituting the cover layer, it is possible to use a ceramic material, in particular, a material that is conformable to a deformation (extension and contraction) of the laminate caused by driving of the piezoelectric actuator, and also becomes deformed under stress so as to eliminate the possibility that creeping discharge may occur due to accidental detachment of the cover layer. Specific examples of such a ceramic material include: ceramic materials that undergo, upon development of a stress, local phase transformation and volumetric changes, and eventually become deformed, such as partially stabilized zirconia and $Ln_{1-x}Si_xAlO_{3+0.5x}$ (wherein Ln represents at least one selected from among Sn, Y, La, Ce, Pr, Nd, Pm, Sm, Eu, Gd, Tb, Dy, Ho, Er, Tm, and Yb, and x=0.01 to 0.3); and piezoelectric materials that undergo variation in interionic distance within a crystalline lattice so as to relax the developed stress, such as barium titanate and lead zirconate titanate. For example, the cover layer is formed by, following the working of the material into ink form, applying the ink material to the side faces of the laminate by means of dipping, screen printing, or otherwise, and thereafter performing sintering operation.

The case 2 constituting the piezoelectric actuator 10 includes the base body 21, the tubular body 22, and a lid body 23. The case 2 receives therein the piezoelectric element 1, A lower end face of the piezoelectric element 1 abuts on the upper surface of the base body 21, and an upper end face of the piezoelectric element 1 abuts on the lower surface of the lid body 23.

The base body 21, the tubular body 22, and the lid body 23 each contain a metal material such for example as. SUS 304 or SUS 316L.

The tubular body 22 is a vertically elongated cylinder opened at both ends. For example, the tubular body 22 is formed by producing a seamless tube of a predetermined shape, and thereafter processing the tube into bellows form by means of rolling, isostatic pressing, or otherwise. The tubular body 22 has a predetermined spring constant so as to exhibit conformability to the extension and contraction of the piezoelectric element 1 that occur on the application of a voltage to the piezoelectric element 1. The spring constant is adjusted according to the thickness and the shape and number of grooves. For example, the tubular body 22 is set to 0.1 mm to 0.5 mm in thickness.

The lid body 23 has an outside diameter which is substantially equal to an inside diameter of an opening at one end of the tubular body 22. The lid body 23 is fitted in the one end-side opening of the tubular body 22, and is joined at a side face (outer periphery) to a part of an inner wall of the tubular body 22 located near the one end-side opening (upper end) thereof by, for example, welding operation.

The base body 21 includes a bottom plate portion 211 and an annular projection 212 disposed upright on the bottom plate portion 211. The bottom plate portion 211 is shaped in a circular plate. In the illustrated embodiment, the bottom plate portion 211 is thinner-walled at the edge than at the other portion. The base body 21 is provided with two holes formed therethrough for insertion of lead pins 33, so that the lead pins 33 are each inserted in corresponding one of the through holes. Moreover, for example, soft glass 34 is placed so as to fill the gap in each through hole for securement of the lead pin 33. A lead wire 31 is connected to a tip of the lead pin 33. The lead wire 31 is attached via solder 32 to the external electrode of the piezoelectric element 1. Via the lead pin 33, the lead wire 31, etc., a driving voltage is applied to the piezoelectric element 1.

The annular projection 212 disposed upright on the upper surface of the bottom plate portion 211 includes an upper-side first region 2121 having a relatively small outside diameter and a lower-side second region 2122 having a relatively large outside diameter, and the annular projection 212 includes a stepped outer surface defined by an outer surface of the first region 2121 and an outer surface of the second region 2122 that are connected with each other. As used herein the term "the first region 2121 having a relatively small outside diameter" means that the outside diameter of the first region 2121 is smaller than the outside diameter of the second region 2122. Likewise, the term "the first region 2121 having a relatively small outside diameter" means that the outside diameter of the first region 2121 is smaller than the outside diameter of the second region 2122. More specifically, the first region 2121 is thinner than the second region 2122.

For example, the first region 2121 is set to 5 mm to 20 mm in outside diameter, whereas the second region 2122 is set to 5.2 mm to 20.2 mm in outside diameter. For example, a thickness difference between the first region 2121 and the second region 2122 falls in the range of 0.1 mm to 7.6 mm.

Moreover, the first region 2121 is inserted inside the tubular body 22, an end face of the tubular body 22 abuts on an upper end of the second region 2122, and the tubular body 22 and the second region 2122 are joined to each other. At this time, a junction portion 4 is formed so as to extend from the lower end of the tubular body 22 to the upper end of the second region 2122. For example, welding operation is adopted for the joining together of the tubular body 22 and the second region 2122.

According to this construction, the first region 2121 can reduce hindrance to vertical vibration, and also reduce horizontal deformation. This renders the junction portion 4 lying between the tubular body 22 and the annular projection 212 less prone to cracking, and thus achieves long-term stabilization in the amount of displacement, as well as enhanced durability.

Figure 4:
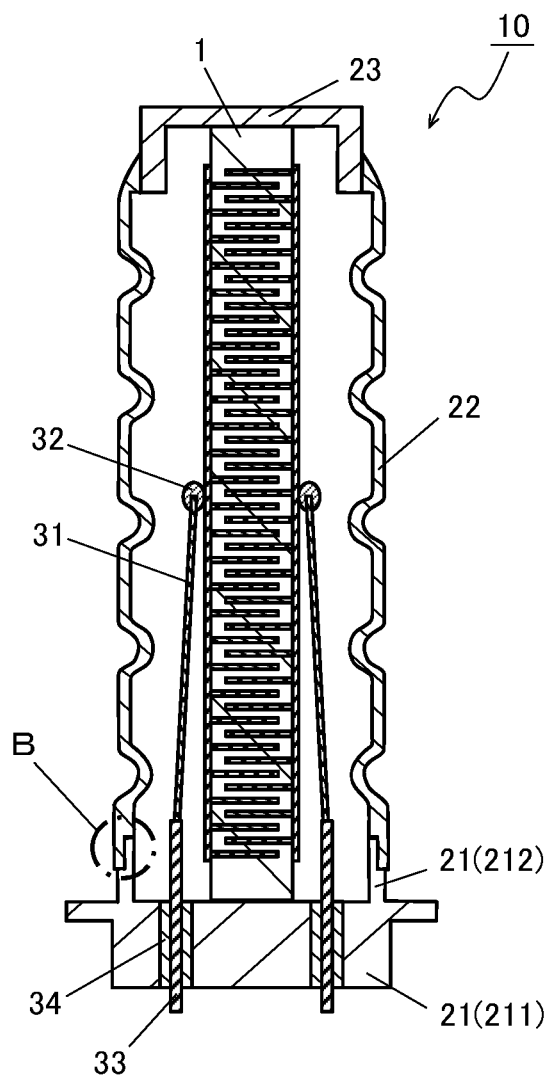
FIG. 4 is a schematic longitudinal sectional view of another embodiment of the piezoelectric actuator taken along the line A-A shown in FIG. 1.
Figure 5:
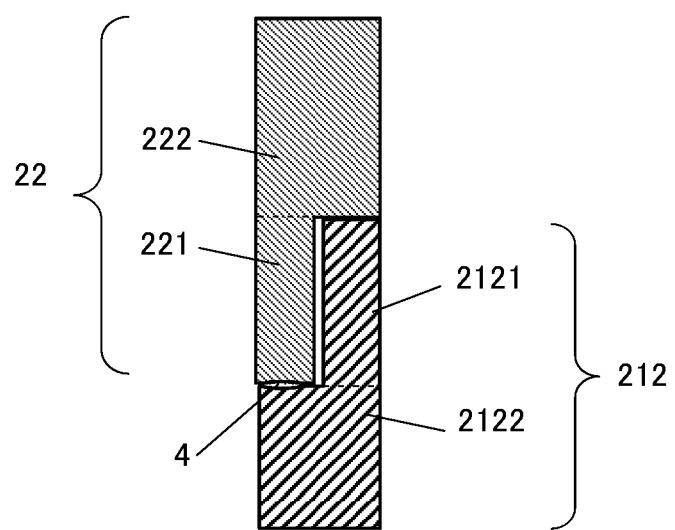
FIG. 5 is an enlarged sectional view of an area B (principal part) of the piezoelectric actuator shown in FIG. 4.

As shown in FIGS. 4 and 5, the tubular body 22 may include a lower-side third region 221 having a relatively large inside diameter and an upper-side fourth region 222 having a relatively small inside diameter, the tubular body 22 may include a stepped inner surface defined by an inner surface of the third region 221 and an inner surface of the fourth region 222 that are connected with each other, and the first region 2121 may be inserted inside the third region 221.

For example, the third region 221 is set to 5.01 mm to 20.01 mm in inside diameter, whereas the fourth region 222 is set to 4.91 mm to 19.91 mm in inside diameter. For example, a thickness difference between the third region 221 and the fourth region 222 falls in the range of 0.05 mm to 0.45 mm.

In this construction, during the application of tensile and compressive loads, the resulting stress is dispersed at a boundary area between the third region 221 and the fourth region 222 and a boundary area between the first region 2121 and the second region 2122 (boundary areas between thick and thin regions), and therefore, the stress applied to the junction portion 4 is relaxed.

Figure 6:
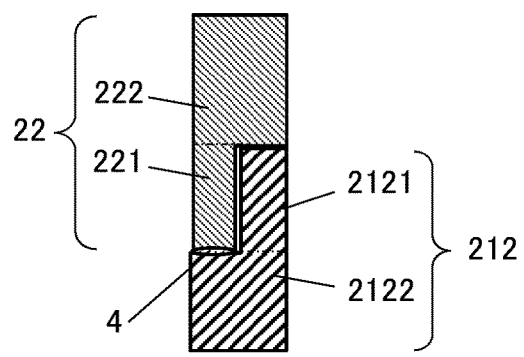
FIG. 6 is an enlarged sectional view of still another embodiment of the principal part of the piezoelectric actuator.

Moreover, as shown in FIG. 6, the outside diameter of the tubular body 22 may be equal to or smaller than the outside diameter of the second region 2122. During the application of a compressive load, the tubular body 22 is less prone to being loaded in a direction in which it expands (tilts) outwardly, and the stress applied to the junction portion 4 is relaxed.

Figure 7:
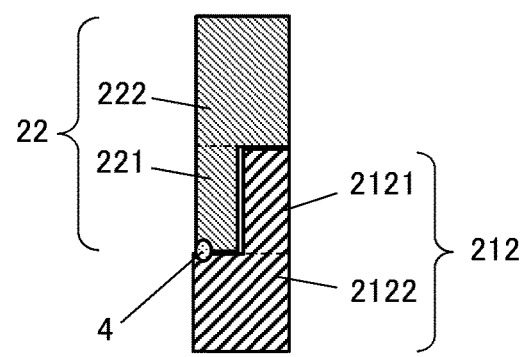
FIG. 7 is an enlarged sectional view of still another embodiment of the principal part of the piezoelectric actuator.

Moreover, as shown in FIG. 7, the junction portion 4 lying between the tubular body 22 and the second region 2122 may be positioned on an outer side of the center of the end face of the tubular body 22 when viewed in section. In this case, a part of the end face of the tubular body 22 located on an inner side of the center thereof remains in an unbonded state, and therefore the stress applied to the junction portion 4 is relaxed.

Figure 8:
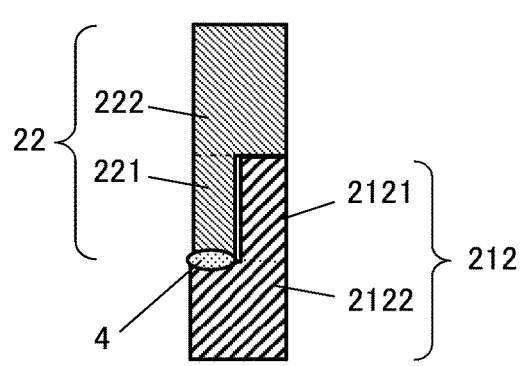
FIG. 8 is an enlarged sectional view of still another embodiment of the principal part of the piezoelectric actuator.

Meanwhile, as shown in FIG. 8, the junction portion 4 lying between the tubular body 22 and the second region 2122 may be disposed over the entire area of the end face of the tubular body 22 when viewed in section. In this case, since the junction portion is most firmly secured, the tensile and compressive loads can be transmitted well.

Figure 9:
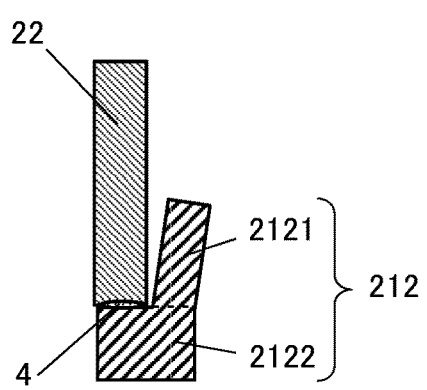
FIG. 9 is an enlarged sectional view of still another embodiment of the principal part of the piezoelectric actuator.

Moreover, as shown in FIG. 9, the first region 2121 may be inwardly inclined, a gap may be provided between the outer surface of the first region 2121 and an inner surface of the tubular body 22, and the gap may be wider at the part located on an upper side of the first region 2121 than at the part located on a lower side of the first region 2121. According to this configuration, when the piezoelectric element 1 is driven to undergo extension and contraction, even if the first region 2121 and the tubular body 22 are moved in relation to one another in an extension and contraction direction of the piezoelectric element 1, it never occurs that the first region 2121 and the tubular body 22 rub against each other, and the amount of displacement becomes stable for the long term. At this time, the angle of inward inclination of the first region 2121 relative to the extension and contraction direction of the piezoelectric element 1 is set to, for example, a range of 1 to 30 degrees.

Figure 10:
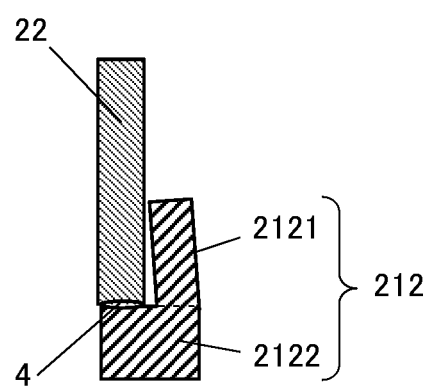
FIG. 10 is an enlarged sectional view of still another embodiment of the principal part of the piezoelectric actuator.

Meanwhile, as shown in FIG. 10, the first region 2121 may be outwardly inclined, a gap may be provided between the outer surface of the first region 2121 and the inner surface of the tubular body 22 and the gap may be narrower at the part located on the upper side of the first region 2121 than at the part located on the lower side of the first region 2121. According to this configuration, even if condensation occurs in the gap between the outer surface of the first region 2121 and the inner surface of the tubular body 22, dew condensation water can be trapped therein, and no moisture can reach the piezoelectric element 1.

At this time, the angle of outward inclination of the first region 2121 relative to the extension and contraction direction of the piezoelectric element 1 is set to, for example, a range of 1 to 30 degrees. Even in a portion where the distance between the outer surface of the first region 2121 and the inner surface of the tubular body 22 is the shortest, it is preferable that a gap is provided such that they do not come into contact with each other.

Figure 11:
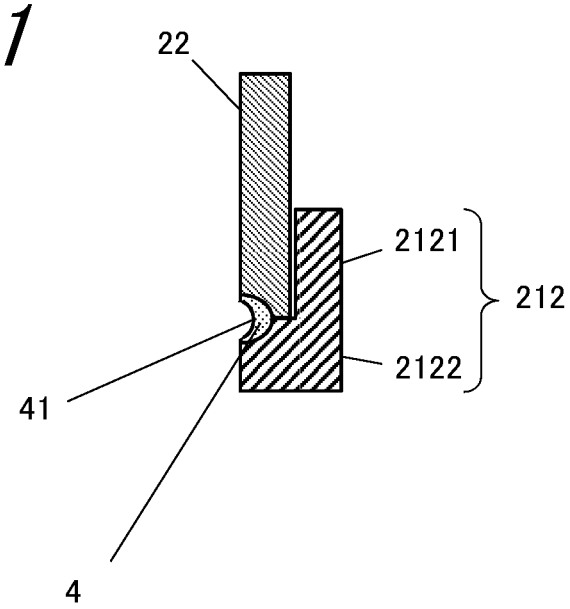
FIG. 11 is an enlarged sectional view of still another embodiment of the principal part of the piezoelectric actuator.

Moreover, as shown in FIG. 11, the junction portion 4 lying between the tubular body 22 and the second region 2122 may be provided with a recess 41 located on an outer periphery of the tubular body 22 when viewed in section. This makes it possible to disperse the stress applied to the junction portion 4. As a result, it is possible to reduce the likelihood of occurrence of cracking in the junction portion 4.

The recess 41 may be provided annularly along the outer periphery of the tubular body 22. Moreover, the recess 41 may be arcuately shaped when viewed in section. In this case, the stress applied to the junction portion 4 can be further relaxed. That is, in the case where the recess 41 of arcuate sectional profile is provided annularly along the outer periphery of the tubular body 22, although the recess 41 undergoes distortion on the application of a stress, by virtue of the annular configuration of the recess 41, the stress can be dispersed annularly along the recess 41. Thus, a part of the junction portion 4 located close to the interior of the tubular body 22 is not subjected to the stress. This makes it possible to reduces the likelihood of occurrence of cracking in the junction portion 4 located at the boundary of the tubular body 22 and the annular projection 212, as well as the likelihood of detachment of the junction portion 4.

Figure 12:
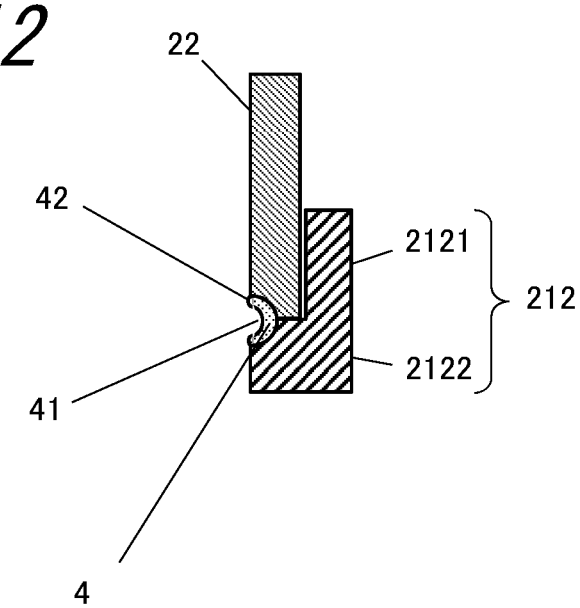
FIG. 12 is an enlarged sectional view of still another embodiment of the principal part of the piezoelectric actuator.

Moreover, as shown in FIG. 12, the junction portion 4 may include, at a part thereof contacted with the tubular body 22, a convexity 42 protruding outwardly beyond the tubular body 22. The part of the junction portion 4 contacted with the tubular body 22, in particular, is an area where a crack may originate. By providing the convexity 42 protruding outwardly beyond the tubular body 22 at the part of the junction portion 4 contacted with the tubular body 22, the amount of the joining material can be increased at the area where a crack may originate. This makes it possible to impart greater strength to the part contacted with the tubular body 22. As a result, it is possible to reduce the likelihood that a crack will originate at the part of the junction portion 4 contacted with the tubular body 22.

Moreover, at a part of the junction portion contacted with the second region 2122, the convexity 42 may be located so as to protrude outwardly beyond the second region 2122. The boundary of the junction portion 4 and the second region 2122 is a stress concentration area where a crack may originate. By locating the convexity 42 so as to protrude outwardly beyond the second region 2122 at the part contacted with the second region 2122, the amount of the joining material can be increased in the area near the boundary of the junction portion 4 and the second region 2122, and this makes it possible to increase the amount of the joining material at the area where a crack may originate. As a result, it is possible to reduce the likelihood that a crack will originate at the part of the junction portion 4 contacted with the second region 2122.

The convexity 42 may be provided annularly in conformity to the annular configuration of the recess 41. This makes it possible to reduce the likelihood that a crack will originate at the part of the junction portion 4 contacted with the tubular body 22 throughout the circumference of the junction portion 4.

Figure 13:
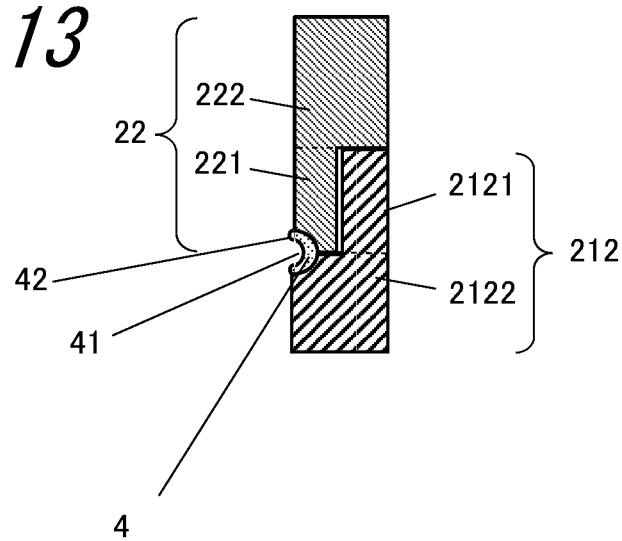
FIG. 13 is an enlarged sectional view of still another embodiment of the principal part of the piezoelectric actuator.

Moreover, as shown in FIG. 13, the tubular body 22 may include a lower-side third region 221 having a relatively large inside diameter and an upper-side fourth region 222 having a relatively small inside diameter, the tubular body 22 may include a stepped inner surface defined by an inner surface of the third region 221 and an inner surface of the fourth region 222 that are connected with each other, and the first region 2121 of the annular projection 212 may be inserted inside the third region 221. This makes it possible not only to produce stress dispersion effects but also to reduce axial deflection of the piezoelectric element 1.

Figure 14:
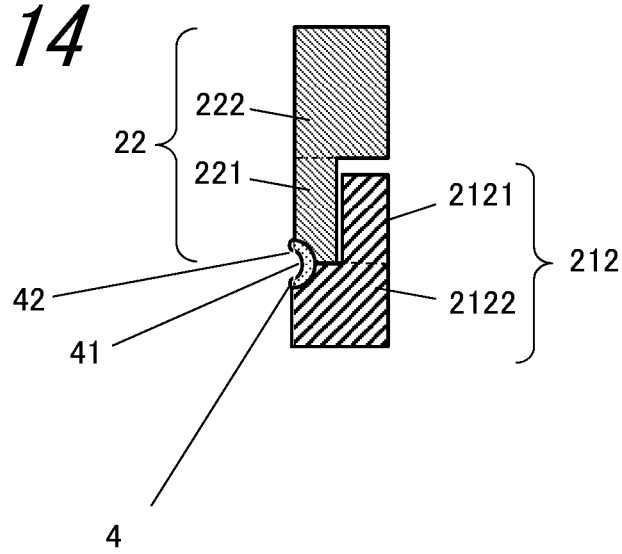
FIG. 14 is an enlarged sectional view of still another embodiment of the principal part of the piezoelectric actuator.

Moreover, as shown in FIG. 14, the third region 221 may be shorter than the first region 2121. Thus, a space can be provided between the second region 2122 and the fourth region 222. As a result, even under the instantaneous application of a great stress, stress relaxation in the recess 41 can be achieved preferentially.

Figure 15:
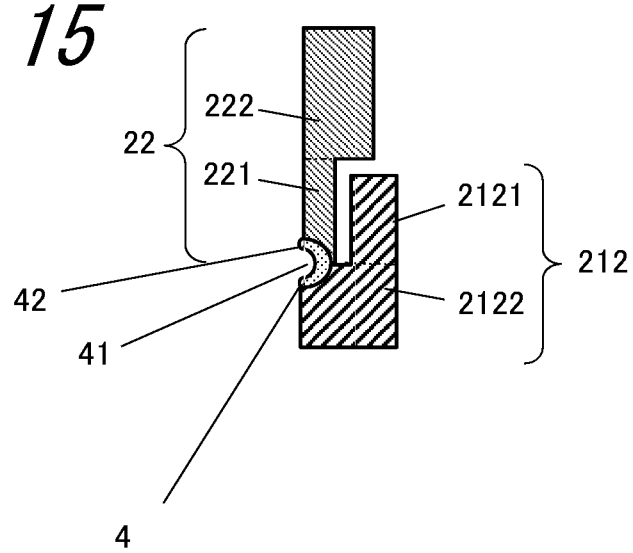
FIG. 15 is an enlarged sectional view of still another embodiment of the principal part of the piezoelectric actuator.

Moreover, as shown in FIG. 15, the third region 221 may be thinner than the first region 2121. Thus, a space can be provided between the first region 2121 and the third region 221. As a result, even under the instantaneous application of a great stress, stress relaxation in the recess 41 can be achieved preferentially.

As a method of forming the recess 41, for example, laser welding is adopted for a welding process. That is, laser welding is carried out so as to define an annular pattern while exercising focus control in a manner permitting energy concentration on the central area of a region irradiated with laser light. Moreover, the projection 42 can be provided along the outer periphery of the irradiated region by carrying out laser pulse irradiation while shifting irradiation positions. Thus, the annular projection 42 can be provided by carrying out welding so as to define an annular pattern.

The following describes a method for manufacturing the piezoelectric actuator.

First, a ceramic green sheet for forming the piezoelectric layer is prepared. More specifically, calcined powder of piezoelectric ceramics, a binder containing an organic high polymer such as acrylic polymer or butyral polymer, and a plasticizer are mixed to prepare a ceramic slurry. Then, a ceramic green sheet is formed from the ceramic slurry by a well-known tape molding technique such as the doctor blade method or the calender roll method. As the piezoelectric ceramics, it is possible to use any material having piezoelectric properties, e.g. a perovskite oxide containing $PbZrO_3$—$PbTiO_3$. Moreover, as the plasticizer, for example, dibutyl phthalate (DBP) or dioctyl phthalate (DOP) may be used.

Next, an electrically conductive paste for forming the internal electrode layer is prepared. More specifically, the conductive paste is prepared by admixing a binder and a plasticizer in metallic powder of a silver-palladium alloy. This conductive paste is printed onto the above-described ceramic green sheet by means of screen printing. Then, a plurality of ceramic green sheets bearing the printed conductive paste are stacked together, and also a plurality of ceramic green sheets bearing no printed conductive paste are stacked together on each end of the conductive paste-bearing ceramic green sheet stack in the lamination direction, thereby obtaining a laminate compact. This laminate compact is subjected to binder removal treatment at a predetermined temperature, and is then fired at a temperature in a range of 900 to 1200° C., thereby obtaining a laminate.

Next, oxide ink is screen-printed onto, of the side faces of the laminate, a pair of side faces to which both of the positive and negative electrodes of the internal electrode layers are led out. After that, the printed ink is fired at a temperature in a range of 900 to 1200° C. into the cover layer to form a cover layer. The oxide ink is prepared by dispersing an oxide powder in a solution containing a solvent, a dispersant, a plasticizer, and a binder, and thereafter passing the resulting mixture solution through the three rolls of a triple-roll mill several times for disintegration of powder agglomeration, as well as for powder dispersion.

Next, the external electrode formed of a metallized layer is formed. To begin with, a silver and glass-containing conductive paste is prepared by adding a binder to silver particles and glass powder. The resulting conductive paste is screen-printed onto the pair of opposed side faces of the laminate to which the positive or negative electrodes of the internal electrode layers are led out, and is then subjected to baking treatment at a temperature in a range of 500 to 800° C. Thus, the external electrode formed of a metallized layer is formed, and the piezoelectric element 1 is completed.

Subsequently, each external electrode of the piezoelectric element 1 is soldered to the lead wire 31. After preparation of the base body 21 which is provided with holes formed therethrough in a hole boring process and is provided with the annular projection 212 as shown in the drawing, the lead pin 33 is inserted through each of the two through holes formed in the base body 21, and the soft glass 34 is placed so as to fill the gap in each through hole for securement of the lead pin 33. Moreover, the lower end face of the piezoelectric element 1 is bonded to the upper surface of the base body 21 with an adhesive. Then, the lead wire 31 soldered to the external electrode of the piezoelectric element 1 and the lead pin 33 attached to the base body 21 are connected to each other by solder.

In forming the annular projections 212 as shown in FIGS. 2 to 10, the metal material for the base body 21 is subjected to grinding using a lathe or casting process so as to obtain the above-desired configuration.

Next, the working of the tubular body 22 made for example of SUS 304 in the form of a seamless tube into a bellows form by rolling operation is carried out. The tubular body 22 is opened at one end (upper end) and the other end (lower end). Changes in groove thickness and radius of curvature can be carried out by varying a die form during the rolling operation.

Moreover, while the configuration of the tubular body 22 as shown in FIGS. 4 to 6 may be obtained by subjecting the end part of the original tubular body to grinding operation using a lathe, the tubular body 22 including the above-desired configuration may primarily be produced by casting.

An opening at one end (upper end) of the tubular body is blocked by fitting the lid body 23 made of SUS 304 in the opening, and then carrying out welding, e.g. laser welding.

Subsequently, the tubular body 22 with the lid body 23 is placed so as to cover the piezoelectric element 1 bonded to the base body 21. Then, the tubular body 22 and the base body 21 are welded to each other by, for example, laser welding under conditions where the tubular body 22 is pulled at a predetermined load, that is, the piezoelectric element 1 is put under a load. As shown in FIGS. 7 and 8, the area where the junction portion 4 is to be formed can be adjusted by controlling laser light intensity.

Finally, a D.C. electric field of 0.1 to 3 kV/m is applied to the lead pin 33 mounted in the base body 21 for polarization of the laminate. Thus, the piezoelectric actuator 10 according to the embodiment is completed.

REFERENCE SIGNS LIST

10: Piezoelectric actuator
1: Piezoelectric element
2: Case
21: Base body
211: Bottom plate portion
212: Annular projection
2121: First region
2122: Second region
22: Tubular body
221: Third region
222: Fourth region
23: Lid body
31: Lead wire
32: Solder
33: Lead pin
34: Soft glass
4: Junction portion
41: Recess
42: Convexity

The invention claimed is:

1. A piezoelectric actuator, comprising:
a piezoelectric element; and
a case comprising a base body and a tubular body, the case being configured to receive the piezoelectric element,
the base body comprising a bottom plate portion and an annular projection disposed upright on the bottom plate portion,
the annular projection comprising
   a first region, the first region being inserted inside the tubular body;
   a second region located below the first region, the second region having a relatively large outside diameter compared to the first region, an end face of the tubular body abutting on an upper end of the second region, and the second region being joined to the tubular body; and
   a stepped outer surface defined by an outer surface of the first region and an outer surface of the second region that are connected with each other,
wherein the first region is inwardly inclined, and a gap is provided between the outer surface of the first region and an inner surface of the tubular body, and
the gap is wider at a part located on an upper side of the first region than at a part located on a lower side of the first region.

2. The piezoelectric actuator according to claim 1,
wherein the tubular body further comprises
   a third region;
   a fourth region located above the third region, the fourth region having a relatively small inside diameter compared to the third region; and
   the inner surface is a stepped inner surface defined by an inner surface of the third region and an inner surface of the fourth region that are connected with each other, and
the first region being inserted inside the third region.

3. The piezoelectric actuator according to claim 1,
wherein an outside diameter of the tubular body is equal to or smaller than the outside diameter of the second region.

4. The piezoelectric actuator according to claim 1,
wherein a junction portion lying between the tubular body and the second region is positioned on an outer side of a center of the end face of the tubular body when viewed in cross section.

5. The piezoelectric actuator according to claim 1,
wherein a junction portion lying between the tubular body and the second region is disposed over an entire area of the end face of the tubular body when viewed in cross section.

6. A piezoelectric actuator comprising:
a piezoelectric element; and
a case comprising a base body and a tubular body, the case being configured to receive the piezoelectric element,
the base body comprising a bottom plate portion and an annular projection disposed upright on the bottom plate portion,
the annular projection comprising
   a first region, the first region being inserted inside the tubular body;
   a second region located below the first region, the second region having a relatively large outside diameter compared to the first region, an end face of the tubular body abutting on an upper end of the second region, and the second region being joined to the tubular body; and
   a stepped outer surface defined by an outer surface of the first region and an outer surface of the second region that are connected with each other,
wherein the first region is outwardly inclined, and a gap is provided between the outer surface of the first region and an inner surface of the tubular body, and
the gap is narrower at a part located on an upper side of the first region than at a part located on a lower side of the first region.

7. The piezoelectric actuator according to claim 6,
wherein
the tubular body further comprises
   a third region,
   a fourth region located above the third region, the fourth region having a relatively small inside diameter compared to the third region, and
   the inner surface is a stepped inner surface defined by an inner surface of the third region and an inner surface of the fourth region that are connected with each other; and
the first region being inserted inside the third region.

8. The piezoelectric actuator according to claim 6,
wherein an outside diameter of the tubular body is equal to or smaller than the outside diameter of the second region.

9. The piezoelectric actuator according to claim 6,
wherein a junction portion lying between the tubular body and the second region is positioned on an outer side of a center of the end face of the tubular body when viewed in cross section.

10. The piezoelectric actuator according to claim 6,
wherein a junction portion is disposed over an entire area of the end face of the tubular body when viewed in cross section.

11. A piezoelectric actuator comprising:
a piezoelectric element; and
a case comprising a base body and a tubular body, the case being configured to receive the piezoelectric element,
the base body comprising a bottom plate portion and an annular projection disposed upright on the bottom plate portion, the annular projection comprising
- a first region, the first region being inserted inside the tubular body;
- a second region located below the first region, the second region having a relatively large outside diameter compared to the first region, an end face of the tubular body abutting on an upper end of the second region, and the second region being joined to the tubular body; and
- a stepped outer surface defined by an outer surface of the first region and an outer surface of the second region that are connected with each other, wherein a junction portion lying between the tubular body and the second region is provided with a recess located on an outer periphery of the tubular body when viewed in cross section.

12. The piezoelectric actuator according to claim 11, wherein the junction portion protrudes outwardly beyond the tubular body at a part contacted with the tubular body.

13. The piezoelectric actuator according to claim 11, wherein the junction portion protrudes outwardly beyond the second region at a part contacted with the second region.

14. The piezoelectric actuator according to claim 11, wherein the tubular body further comprises
- a third region,
- a fourth region located above the third region, the fourth region having a relatively small inside diameter compared to the third region, and
- a stepped inner surface defined by an inner surface of the third region and an inner surface of the fourth region that are connected with each other; and the first region being inserted inside the third region.

15. The piezoelectric actuator according to claim 11, wherein an outside diameter of the tubular body is equal to or smaller than the outside diameter of the second region.

16. The piezoelectric actuator according to claim 11, wherein the junction portion is positioned on an outer side of a center of the end face of the tubular body when viewed in cross section.

17. The piezoelectric actuator according to claim 11, wherein a junction portion lying between the tubular body and the second region is disposed over an entire area of the end face of the tubular body when viewed in cross section.

* * * * *